(12) United States Patent
Ravi et al.

(10) Patent No.: US 7,715,493 B2
(45) Date of Patent: May 11, 2010

(54) DIGITAL TRANSMITTER AND METHODS OF GENERATING RADIO-FREQUENCY SIGNALS USING TIME-DOMAIN OUTPHASING

(75) Inventors: Ashoke Ravi, Hillsboro, OR (US); Ravi Naiknaware, Portland, OR (US); Krishnamurthy Soumyanath, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 890 days.

(21) Appl. No.: 11/464,352

(22) Filed: Aug. 14, 2006

(65) Prior Publication Data

US 2008/0037662 A1 Feb. 14, 2008

(51) Int. Cl.
*H04L 25/49* (2006.01)
*H04B 1/04* (2006.01)
(52) U.S. Cl. .................... 375/296; 455/114.3
(58) Field of Classification Search ................ 375/260, 375/285, 295–297; 455/63.1, 114.2, 114.3; 332/103
See application file for complete search history.

(56) References Cited

U.S. PATENT DOCUMENTS 6,337,606 B1 * 1/2002 Brombaugh et al. ........ 332/103
6,362,701 B1 * 3/2002 Brombaugh et al. ........ 332/103
6,377,967 B1 * 4/2002 Wiegand ..................... 708/300
6,490,440 B1 * 12/2002 Mielke et al. ............... 455/102
6,996,191 B1 * 2/2006 Meditz ........................ 375/308
7,012,477 B2 * 3/2006 Harron et al. ............... 332/108

OTHER PUBLICATIONS

Bateman, A., "The Combined Analogue Locked Loop Universal Modulator (CALLUM)", *Proceedings, 42nd VTS Conference—Frontiers of Technology*, vol. 2, (May 10-13, 1992, Denver, CO, (1992), 759-763.
Chireix, H., "High Power Outphasing Modulation", *Proceedings of the Institute of Radio Engineers (IRE)* vol. 23, No. 11, (Nov. 1935), 1370-1392.
Cox, D. C., "Linear Amplification With Nonlinear Components", *IEEE Transactions on Communications*, vol. COM-22, No. 12, (Dec. 1974), 1942-1945.
Hamedi-Hagh, S., et al., "CMOS Wireless Phase-Shifted Transmitter", *IEEE Journal of Solid-State Circuits*, vol. 39 No. 8, (Aug. 2004), 1241-1252.

* cited by examiner

*Primary Examiner*—Khanh C Tran
(74) *Attorney, Agent, or Firm*—Schwegman, Lundberg & Woessner, P.A.; Gregory J. Gorrie

(57) ABSTRACT

Embodiments of a multicarrier transmitter and method of generating an RF signal for transmission are generally described herein. Other embodiments may be described and claimed. In some embodiments, a multicarrier transmitter generates RF signals for transmission using non-linear switching power amplifiers to amplify outphased switching waveforms allowing the multicarrier transmitter to operate more efficiently than some conventional multicarrier transmitters.

28 Claims, 8 Drawing Sheets

MULTICARRIER TRANSMITTER

MULTICARRIER TRANSMITTER $$y_0(t) = A\cos(\omega t + \theta(t) + \phi(t)) + A\cos(\omega t + \theta(t) - \phi(t)) \text{ —209A}$$

$$= A\cos(\phi(t))\cos(\omega t + \theta(t)) \text{ —209B}$$

$$\phi(t) = \cos^{-1}\left(\frac{\sqrt{I^2(t) + Q^2(t)}}{A}\right) \text{ —211B}$$

$$\theta(t) = \tan^{-1}\left(\frac{Q(t)}{I(t)}\right) \text{ —211A}$$

DELAY VERNIER DELAY-LINE

POLAR TRANSMITTER

DIGITAL TRANSMITTER AND METHODS OF GENERATING RADIO-FREQUENCY SIGNALS USING TIME-DOMAIN OUTPHASING

TECHNICAL FIELD

Some embodiments of the present invention pertain to wireless communications. Some embodiments relate to radio-frequency (RF) transmitters. Some embodiments relate to the transmission of multicarrier waveforms, such as orthogonal frequency division multiplexed (OFDM) waveforms. Some embodiments of the present invention relate to time-domain outphasing transmitters. Some embodiments of the present invention relate to polar transmitters.

BACKGROUND

Multicarrier waveforms, such as orthogonal frequency division multiplexed (OFDM) waveforms, have amplitude and phase information modulated thereon. These waveforms are conventionally amplified for transmission using linear or near-linear power amplifiers to reduce distortion of this information. The inherently low efficiency of these linear and near-linear power amplifiers results in increased power consumption and/or increased heat generation. Furthermore, the significant peak-to-average power ratios (i.e., 10-15 dB) of some multicarrier waveforms may further reduce the average efficiency of linear or near-linear power amplifiers. Increased power consumption and increased heat generation are undesirable characteristics, particularly for portable, mobile and handheld wireless devices that rely on batteries. Non-linear power amplifiers are generally more efficient than linear and near-linear power amplifiers, however direct amplification of a multicarrier waveform by non-linear power amplifiers may distort the amplitude and phase information, making non-linear power amplifiers unsuitable for use in conventional OFDM transmitters.

Many conventional transmitters use analog circuitry, which is more sensitive to process, voltage and temperature (PVT) variations than digital circuitry. Analog circuitry also utilizes large inductors that may occupy a larger die area and are less compatible with some semiconductor processes, such as complementary metal-oxide semiconductor (CMOS) processes, than digital circuitry. Analog circuitry may also require greater voltages than digital circuitry making it less compatible with low-voltage semiconductor processes.

Thus, there are general needs for multicarrier transmitters that are more efficient, consume less power, and/or are less sensitive to PVT variations. There are also general needs for multicarrier transmitters that are compatible with low-voltage semiconductor processes.

DETAILED DESCRIPTION

The following description and the drawings sufficiently illustrate specific embodiments of the invention to enable those skilled in the art to practice them. Other embodiments may incorporate structural, logical, electrical, process, and other changes. Examples merely typify possible variations. Individual components and functions are optional unless explicitly required, and the sequence of operations may vary. Portions and features of some embodiments may be included in, or substituted for, those of other embodiments. Embodiments of the invention set forth in the claims encompass all available equivalents of those claims. Embodiments of the invention may be referred to herein, individually or collectively, by the term "invention" merely for convenience and without intending to limit the scope of this application to any single invention or inventive concept if more than one is in fact disclosed.

Figure 1:
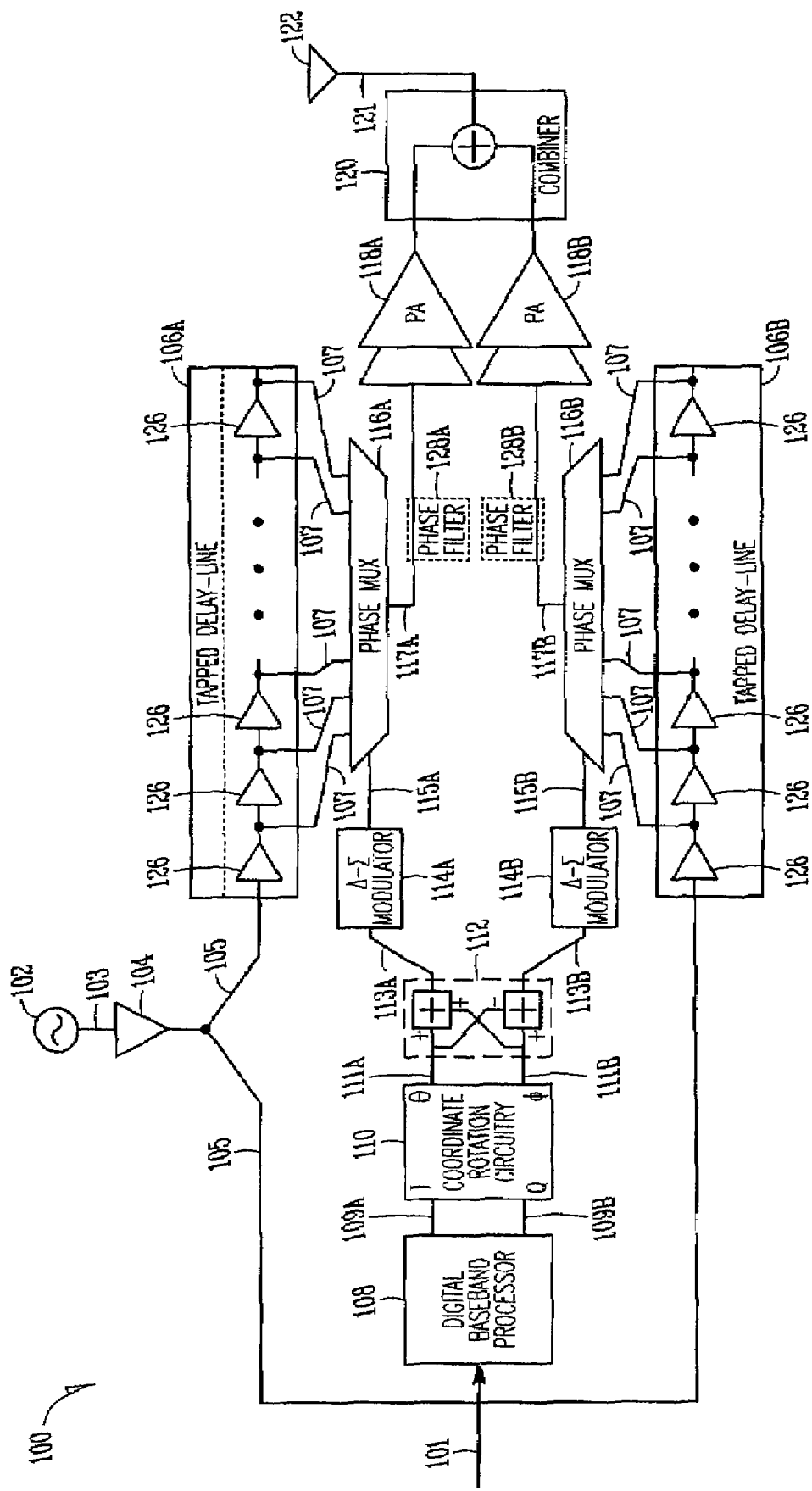
FIG. 1 is a functional block diagram of a multicarrier transmitter in accordance with some embodiments of the present invention.

FIG. 1 is a functional block diagram of a multicarrier transmitter in accordance with some embodiments of the present invention. Multicarrier transmitter 100 generates RF signals for transmission using non-linear switching power amplifiers (PAs) 118A & 118B to amplify outphased switching waveforms 117A & 117B allowing multicarrier transmitter 100 to operate more efficiently than some conventional multicarrier transmitters. In these embodiments, the modulating signals are generated as 1 bit delta-signal signals and only need to switch on and off switching power amplifiers 118A & 118B.

In accordance with some embodiments, digital baseband signals 109A & 109B are decomposed to generate phase-selection signals 115A & 115B, and tapped delay-lines 106A & 106B provide a plurality of phases 107 of square-wave signal 105. Square-wave signal 105 may be at the transmit frequency. In some embodiments, phase multiplexers (MUX) 116A & 116B select one of phases 107 based on phase-selection signals 115A & 115B to provide outphased switching waveforms 117A & 117B to switching power amplifiers 118A & 118B. After amplification, outphased switching waveforms 117A & 117B are combined to generate RF signals 121 for transmission by antenna 122.

In some embodiments, tapped delay-lines 106A & 106B may be stabilized tapped delay-lines. These embodiments are described in more detail below. In some embodiments, the plurality of phases 107 provided by tapped delay-lines 106A & 106B may comprise delayed versions of square-wave signal 105.

In some embodiments, outphased switching waveforms 117A & 117B comprise substantially constant-envelope signals representing two outphased components of the RF signal for transmission. The two outphased components may be referred to as s1 and s2, although the scope of the invention is not limited in this respect. Substantially constant-envelope signals may refer to signals having a non-varying or substantially constant amplitude. In other words, information is not encoded on the amplitude component.

In some embodiments, phase multiplexers 116A & 116B may comprise first phase multiplexer 116A and second phase multiplexer 116B. First phase multiplexer 116A may select an output based on first phase-selection signal 115A comprising a first outphased component of the decomposed baseband signals. Second phase multiplexer 116B may select an output based on second phase-selection signal 115B comprising another outphased component of the decomposed baseband signals.

In some embodiments, tapped delay-lines 106A & 106B may comprise first tapped delay-line 106A and second tapped delay-line 106B. First tapped delay-line 106A may provide a first plurality of phases 107 of square-wave signal 105 to first phase multiplexer 116A. Second tapped delay-line 106B may provide a second plurality of phases 107 of square-wave signal 105 to second phase multiplexer 116B. In some alternate embodiments, instead of two tapped delay-lines 106A & 106B, a single tapped delay-line may be used coupled to both phase multiplexers 116A and 116B, although the scope of the invention is not limited in this respect.

In some embodiments, switching power amplifiers 118A & 118B may operate in a non-linear range to separately amplify outphased switching waveforms 117A & 117B. In these embodiments, outphased switching waveforms 117A & 117B may comprise substantially constant-envelope square-wave signals, although the scope of the invention is not limited in this respect. When outphased switching waveforms 117A & 117B are constant-envelope square-wave signals, switching power amplifiers 118A & 118B may operate in a highly efficient non-linear range. In some embodiments, switching power amplifiers 118A & 118B may comprise class-D, class-E, or class-F non-linear power amplifiers, although the scope of the invention is not limited in this respect. In some embodiments, switching power amplifiers 118A & 118B may comprise linear power amplifiers biased in deep class-AB or class-B, although the scope of the invention is not limited in this respect. In some of these embodiments, two or more switching power amplifiers may be used for power amplifier 118A, and two or more switching power amplifiers may be used for power amplifier 118B. In some alternate embodiments, 1-bit power digital-to-analog converters (DAC) may be used for power amplifiers 118A and 118B, although the scope of the invention is not limited in this respect.

In some of these embodiments, each of power amplifiers 118A & 118B may only need to deliver half the power as compared to some conventional transmitters that use a single power amplifier. In these embodiments, higher efficiency may be achieved in non-linear operation while avoiding break-down voltage issues and reducing hot-carrier effects sometimes associated with higher power levels.

In some embodiments, combiner 120 may be used to combine the separately amplified outphased switching waveforms 117A & 117B to generate RF signal 121 for transmission by antenna 122. In some embodiments, combiner 120 may be a microwave signal or power combiner, although the scope of the invention is not limited in this respect. In some embodiments, combiner 120 may also be a current or voltage combiner, although the scope of the invention is not limited in this respect.

In accordance with embodiments, power amplifier 118A may amplify outphased 117A, and power amplifier 118B may amplify outphased 117B. The separate amplification of outphased switching waveforms 117A & 117B allows these constant-envelope signals to be amplified with switching power amplifiers achieving high efficiency while preserving the phase information. By combining the separately amplified outphased switching waveforms 117A & 117B, a multi-carrier signal, such as an OFDM signal, may be provided at the output of combiner 120 with both amplitude and phase information.

In some embodiments, multicarrier transmitter 100 includes coordinate rotation circuitry 110 to decompose digital baseband signals 109A & 109B. Coordinate rotation circuitry 110 may decompose an in-phase (I) component and a quadrature-phase (Q) component of digital baseband signals 109A & 109B into theta component 111A and phi component 111B. Theta component 111A and phi component 111B may be polar representations of the in-phase and quadrature-phase components of digital baseband signals 109A & 109B. The in-phase and quadrature-phase components, on the other hand, may be viewed as Cartesian representations. In these embodiments, the amplitude and phase information of the in-phase and quadrature-phase components are converted to phase information by coordinate rotation circuitry 110 and are preserved in theta component 111A and phi component 111B. In some embodiments, theta component 111A and phi component 111B may be phasors and may contain the amplitude and phase information present in digital baseband signals 109A & 109B, although the scope of the invention is not limited in this respect.

In these embodiments, outphased switching waveform 117A may comprise square-wave signal 105 delayed by the sum of theta component 111A and phi component 111B. In these embodiments, outphased switching waveform 117B may comprise square-wave signal 105 delayed by the difference between theta component 111A and phi component 111B.

In some embodiments, coordinate rotation circuitry 110 may comprise processing circuitry to perform a "COordinate Rotation DIgital Calculation" (CORDIC) algorithm to generate theta component 111A and phi component 111B, although the scope of the invention is not limited in this respect. In some embodiments, coordinate rotation circuitry 110 may generate theta component 111A and phi component 111B by performing digital arithmetic operations including a vector rotation on the in-phase and quadrature-phase components of digital baseband signals 109A & 109B. In some embodiments, the operations performed by coordinate rotation circuitry 110 may be performed without the use of multipliers other than for output scaling, although the scope of the invention is not limited in this respect.

In some embodiments, multicarrier transmitter 100 may also include signal generator 102 and buffer 104. Signal generator 102 may generate RF signals 103 at the transmit frequency and buffer 104 may generate square-wave signal 105 at the transmit frequency from RF signals 103 for receipt by tapped delay-lines 106A & 106B. In some embodiments, signal generator 102 may be a voltage controlled oscillator (VCO), although other stable and/or low-phase noise sources for generating RF signals may also be suitable. In some embodiments, an on-board synthesizer or clock source may be used for signal generator 102, although the scope of the invention is not limited in this respect.

In some embodiments, the RF signals that are provided by signal generator 102 at the outputs of phase multiplexers 116A & 116B (e.g., outphased switching waveforms 117A and 117B) are referred to as "outphased" waveforms because they are delayed respectively by the amounts of theta plus phi (i.e., a sum component) and theta minus phi (i.e., a difference component).

In some embodiments, multicarrier transmitter 100 may include circuitry to generate phase-selection signals 115A & 115B. The circuitry to generate phase-selection signals 115A & 115B may include digital adder elements 112 to generate sum component 113A and difference component 113B. Sum component 113A may comprise a sum of theta component 111A and phi component 111B. Difference component 113B may comprise a difference between theta component 111A and phi component 111B. In some of these embodiments, outphased switching waveform 117A may comprise square-wave signal 105 delayed by sum component 113A, and outphased switching waveform 117B may comprise square-wave signal 105 delayed by difference component 113B.

In some embodiments, the circuitry to generate phase-selection signals 115A & 115B may also include delta-sigma ($\Delta$-$\Sigma$) modulators 114A & 114B comprising first delta-sigma modulator 114A and second delta-sigma modulator 114B. First delta-sigma modulator 114A may generate first phase-selection signal 115A from sum component 113A, and second delta-sigma modulator 114B may generate second phase-selection signal 115B from difference component 113B. In some embodiments, the delta-sigma modulators 114A and 114B may generate fractional output values by rapidly switching between two integer values based on their input, although the scope of the invention is not limited in this respect. Fractional output values may allow the selection of one of phases 107 by phase multiplexers 116A & 116B. For example, to produce an output fractional value of 5.5, delta-sigma modulator 114A may switch rapidly between five and six so that on the average, the output is about five half the time and about six the other half of the time. In these embodiments, the fractional output values may correspond to phase-selection signals 115A & 115B. In some embodiments, delta-sigma modulators 114A and 114B may allow the selection of an appropriate one of phases 107 in a time-varying manner to produce outphased switching waveforms 117A & 117B with desired phases. The use of delta-sigma modulators 114A and 114B may allow for a finer average phase to be generated at the output of phase multiplexers 116A & 116B.

In some embodiments, multicarrier transmitter 100 may also include a digital baseband processor 108 to generate digital baseband signals 109A & 109B from input bit stream 101. Digital baseband processor 108 may include, among other things, circuitry to modulate bits of bit stream 101 to generate symbols in the frequency domain. Digital baseband processor 108 may also include circuitry to perform an inverse discrete Fourier transform (IDFT), such as an inverse fast Fourier transform (IFFT), on the frequency-domain symbols to generate time-domain digital waveforms corresponding to digital baseband signals 109A & 109B.

In some multicarrier and OFDM embodiments, digital baseband processor 108 may generate quadrature-amplitude modulated (QAM) symbols for each of a plurality of subcarriers to provide a plurality of frequency-domain symbol modulated subcarriers. An IDFT may be performed on the frequency-domain symbol modulated subcarriers to generate the time-domain digital waveforms. In these embodiments, digital baseband signals 109A & 109B may comprise multicarrier time-domain baseband signals, although the scope of the invention is not limited in this respect.

In some embodiments, tapped delay-lines 106A & 106B comprise a plurality of delay elements 126 having intrinsic delays substantially less than a period of the square-wave signal 105, although the scope of the invention is not limited in this respect. In some embodiments, each delay element 126 may provide one of phases 107, although the scope of the invention is not limited in this respect as other configurations for tapped delay-lines 106A & 106B may also be suitable. In some embodiments, each delay element 126 may synthesize a different one of phases 107. In some embodiments, square-wave signal 105 may comprise a clock waveform having a clock period, and delay elements 126 may have intrinsic delays substantially less than the clock period, although the scope of the invention is not limited in this respect.

In some embodiments, the amount of delay between phases 107 (e.g., a step size) generated by each tapped delay-line 106A & 106B may be relatively small (e.g., 10 pico-seconds of phase shift) while the oversampling ratio with respect to the period of square-wave signal 105 may be large (e.g., a few hundred pico-seconds). In some embodiments, the quantization noise produced by tapped delay-lines 106A & 106B may be low both in-band and out-of-band, allowing for relaxed filtering requirements. These embodiments may be less sensitive to process, voltage and temperature (PVT) variations, causing less degradation in the modulation quality (i.e., a low the error vector magnitude (EVM)), although the scope of the invention is not limited in this respect. In some embodiments, conventional tapped delay-lines may have adequate resolution for use as tapped delay-lines 106A & 106B. In some alternate embodiments, finer resolution tapped delay-lines may be used to provide even less sensitivity to PVT variations and/or cause less degradation in the modulation quality, although the scope of the invention is not limited in this respect. Some examples of tapped delay-lines suitable for use as tapped delay-lines 106A & 106B are described in more detail below.

In some alternate embodiments, phase-selection signals 115A & 115B may comprise control words for use in selecting one of phases 107 by phase multiplexers 116A & 116B. In some of these embodiments, tapped delay-lines 106A & 106B may comprise digital delay-lines, discussed in more detail below in reference to FIGS. 6A-6E.

Antenna 122 may comprise one or more directional or omnidirectional antennas, including, for example, dipole antennas, monopole antennas, patch antennas, loop antennas, microstrip antennas or other types of antennas suitable for transmission of RF signals. In some multiple-input, multiple-output (MIMO) embodiments, two or more antennas may be used. In some of these multiple-antenna embodiments, instead of two or more antennas, a single antenna with multiple apertures may be used. In these multiple-antenna embodiments, each aperture may be considered a separate antenna. In some multiple-antenna embodiments, each antenna may be effectively separated to take advantage of spatial diversity and the different channel characteristics that may result between each of the antennas and another wireless communication device. In some multiple-antenna embodiments, the antennas may be separated by up to $\frac{1}{10}$ of a wavelength or more.

In some embodiments, multicarrier transmitter 100 may be part of a multi-mode communication device. In these embodiments, multicarrier transmitter 100 may be configured to communicate in accordance with one or more communication standards and/or techniques through the switching in and out of logic gates and variation of frequencies.

In some embodiments, delta-sigma modulators 114A & 114B may improve time resolution to a required accuracy by shaping the time quantization noise out-of-band. Since the quantization steps may be smaller than the voltage or current quantization steps achievable on chip, out-of-band filtering requirements may be relaxed. In some conventional outphasing transmitters, the limiting action of power amplifiers may result in significant spectral growth. Multicarrier transmitter 100, on the other hand, may reduce and/or eliminate significant spectral growth by encoding outphased switching waveforms 117A & 117B with very fine time delays. This is accomplished by driving power amplifiers 118A and 118B with phase-encoded constant-envelope signals, rather than with signals having an amplitude component.

In accordance with some embodiments, mismatches between the two paths that generate outphased switching waveforms 117A and 117B may be digitally calibrated and/or corrected. In some of these embodiments, mismatches between the two paths may be measured at the output of combiner 120 and corrected by adjusting the component outputs of coordinate rotation circuitry 110. In some embodiments, an adaptive filter or adaptive equalizer may be used, although the scope of the invention is not limited in this respect. In some embodiments, the calibration may reduce and/or cancel spectrum spreading to prevent disruption of adjacent frequency channels. Because multicarrier transmitter 100 uses phase information from digital baseband signals 109A & 109B, calibration may be easier.

In some embodiments, multicarrier transmitter 100 may include optional phase filters 128A and 128B to help filter out-of-band components from outphased switching waveforms 117A & 117B prior to respective amplification by switching power amplifiers 118A & 118B. These embodiments may further reduce spectral growth of RF signals 121, although the scope of the invention is not limited in this respect.

Although multicarrier transmitter 100 is illustrated as having several separate functional elements, one or more of the functional elements may be combined and may be implemented by combinations of software-configured elements, such as processing elements including digital signal processors (DSPs), and/or other hardware elements. For example, some elements may comprise one or more microprocessors, DSPs, application specific integrated circuits (ASICs), and combinations of various hardware and logic circuitry for performing at least the functions described herein. In some embodiments, the functional elements of multicarrier transmitter 100 may refer to one or more processes operating on one or more processing elements. In some digital embodiments, the functional elements of multicarrier transmitter 100 illustrated in FIG. 1 may all be implemented digitally (except for antenna 122 and/or combiner 120) on a single semiconductor die, although the scope of the invention is not limited in this respect. The use of phase information (e.g., time resolution), rather than amplitude information (e.g., voltage resolution) may allow circuitry to be fabricated using low-voltage semiconductor processes, such as low-voltage CMOS processes, although the scope of the invention is not limited in this respect.

Figure 2:
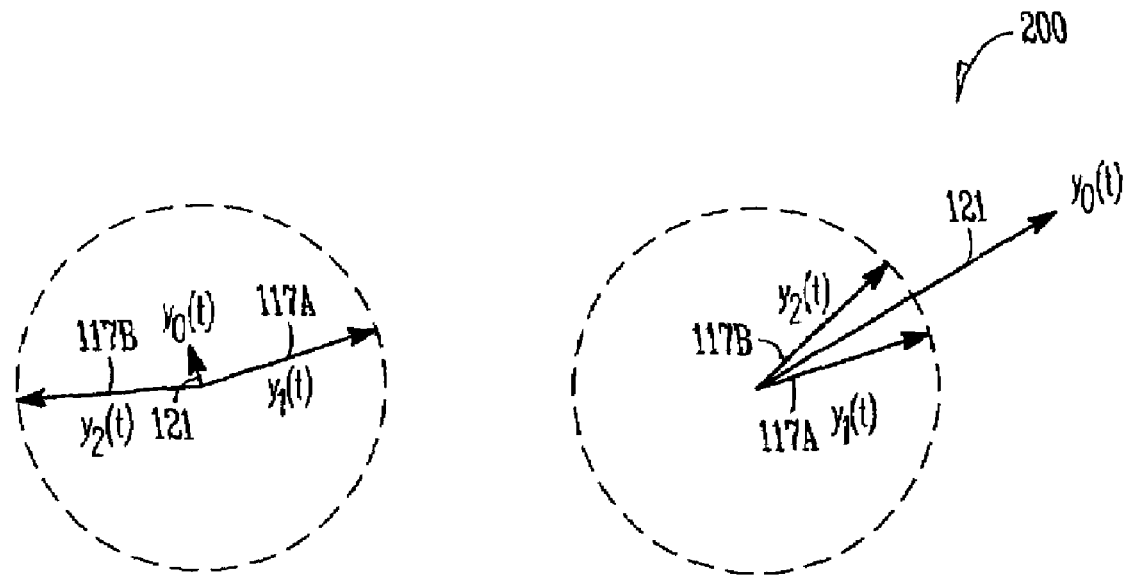
FIG. 2 illustrates mathematically the generation of signals from outphased components in accordance with some embodiments of the present invention.

FIG. 2 illustrates mathematically the generation of signals from outphased components in accordance with some embodiments of the present invention. Dashed circles 200 illustrate constant-envelope signals $y_1(t)$ and $y_2(t)$ corresponding respectively to outphased switching waveforms 117A and 117B (FIG. 1) representing the two outphased components of RF signal 121 (FIG. 1) for transmission, illustrated as $y_0(t)$. Equations 209A and 209B describe the generation of the combined signal $y_0(t)$ from phi component $\phi(t)$ and theta component $\theta(t)$. Equation 209B is a simplification of equation 209A.

Referring to FIGS. 1 and 2 together, equation 211A illustrates the generation of theta component $\theta(t)$ from the in-phase (I) and quadrature-phase (Q) components of digital baseband signals 109A & 109B. Equation 211B illustrates the generation of phi component $\phi(t)$ from the in-phase and quadrature-phase components of digital baseband signals 109A & 109B. In these equations, the in-phase component of digital baseband signals 109A & 109B is illustrated as I(t), and the quadrature-phase component of digital baseband signals 109A & 109B is illustrated as Q(t). In some embodiments, processing circuitry of coordinate rotation circuitry 110 may implement equations 211A and 211B to generate theta component 111A and phi component 111B, respectively, although the scope of the invention is not limited in this respect.

Figure 3:
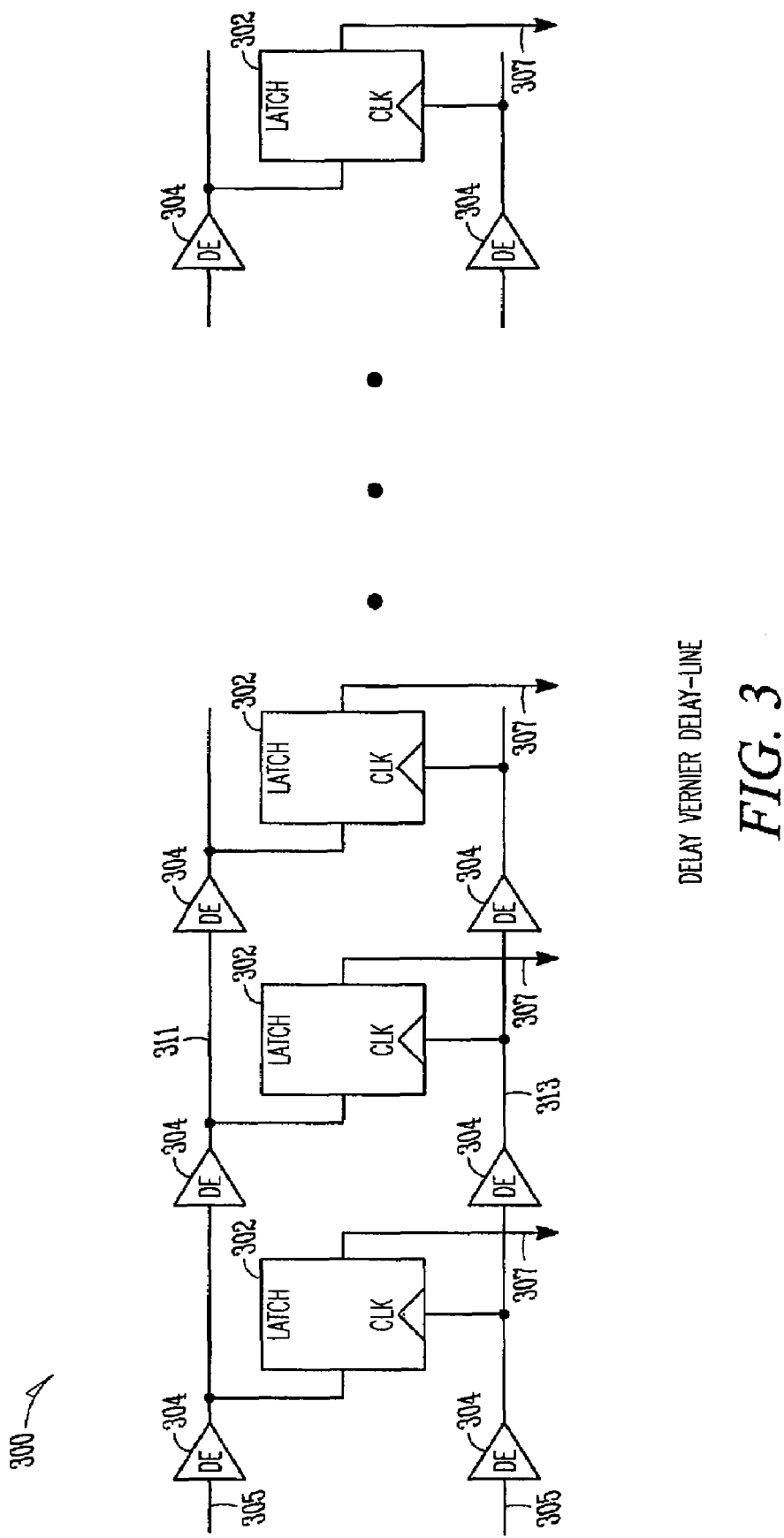
FIG. 3 illustrates a delay vernier delay-line suitable for use with some embodiments of the present invention.

FIG. 3 illustrates a delay vernier delay-line in accordance with some embodiments of the present invention. In these embodiments, delay vernier delay-line 300 may be suitable for use as tapped delay-line 106A and for tapped delay-line 106B. Delay vernier delay-line 300 may include a plurality of delay elements (DE) 304 to delay square-wave signal 305, and a plurality of latches 302 to sample the delayed signals. Some of delay elements 304 may be arranged to form first delay-line 311 to provide the input signals to latches 302, and some of delay elements 304 may be arranged to form second delay-line 313 to provide the clock (CLK) inputs to latches 302 as illustrated. Delay vernier delay-line 300 may provide a plurality of phases 307, which may comprise differences between delay-lines 311 and 313, although the scope of the invention is not limited in this respect.

In these embodiments, phases 307 may correspond to phases 107 (FIG. 1), and square-wave signal 305 may correspond to square-wave signal 105 (FIG. 1). In some embodiments, latches 302 may comprise flip-flop circuitry, and delay elements 304 may comprise either buffers or inverters, although the scope of the invention is not limited in this respect.

Figure 4:
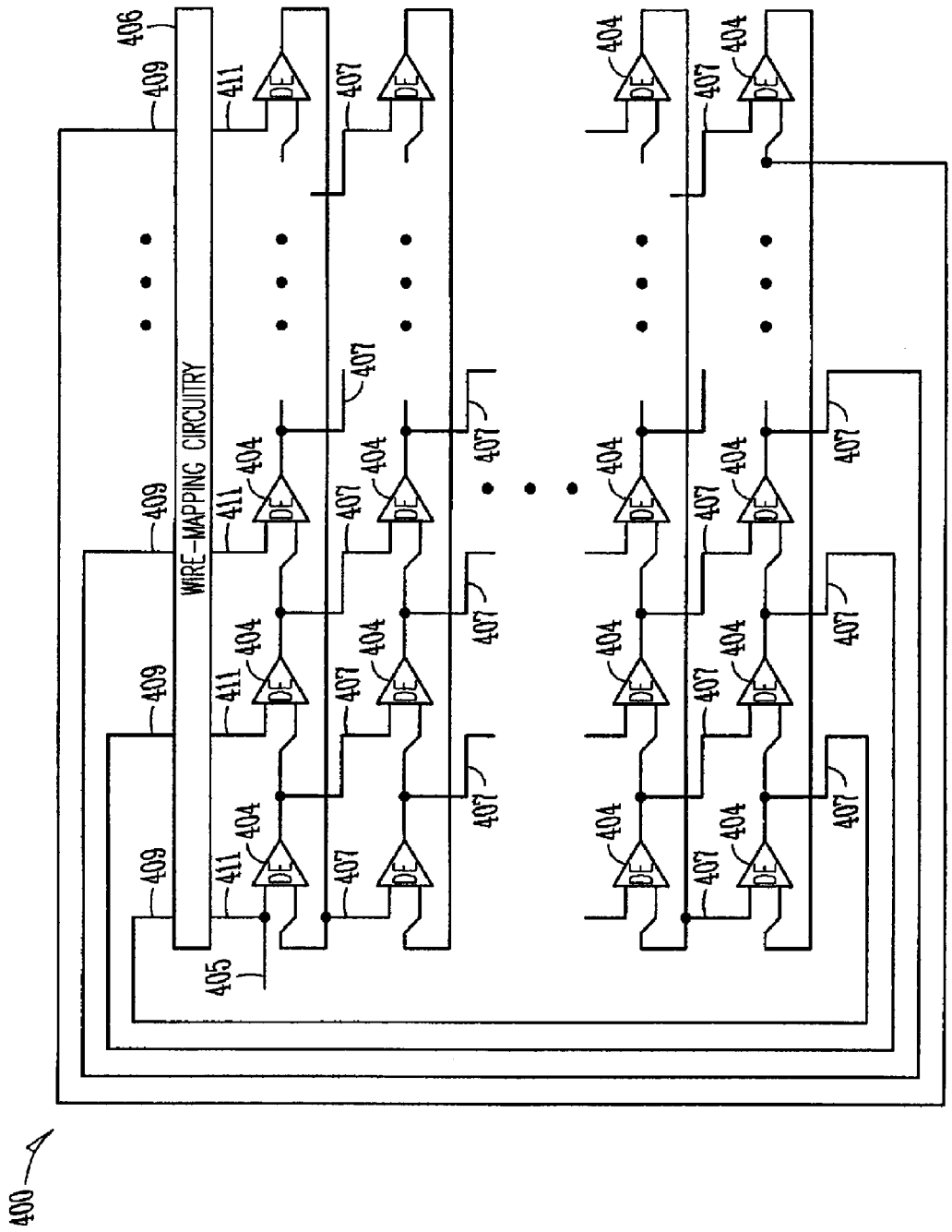
FIG. 4 illustrates a coupled oscillator delay-line suitable for use with some embodiments of the present invention.

FIG. 4 illustrates a coupled oscillator delay-line in accordance with some embodiments of the present invention. In these embodiments, coupled oscillator delay-line 400 may be suitable for use as tapped delay-line 106A and for tapped delay-line 106B. Coupled oscillator delay-line 400 may comprise a plurality of delay elements (DE) 404 configured as illustrated to generate a plurality of phases 407 of square-wave signal 405. In some embodiments, coupled oscillator delay-line 400 may also include wire-mapping circuitry 406 which may reconfigure the connections between inputs 409 and outputs 411 to allow finer differences between phases 407 to be provided. In some embodiments, delay elements 404 may comprise either buffers or inverters. In these embodiments, one row of phases 407 may correspond to phases 107 (FIG. 1), and square-wave signal 405 may correspond to square-wave signal 105 (FIG. 1), although the scope of the invention is not limited in this respect.

Figure 5A:
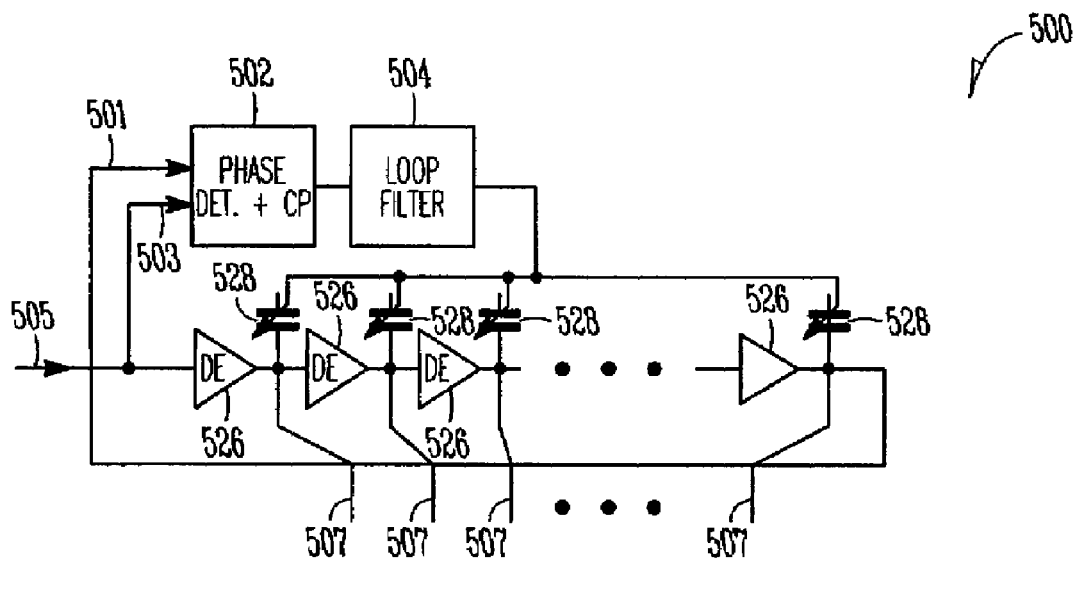
FIGS. 5A and 5B illustrate a delay-locked loop (DLL) delay-line suitable for use with some embodiments of the present invention.
Figure 5B:
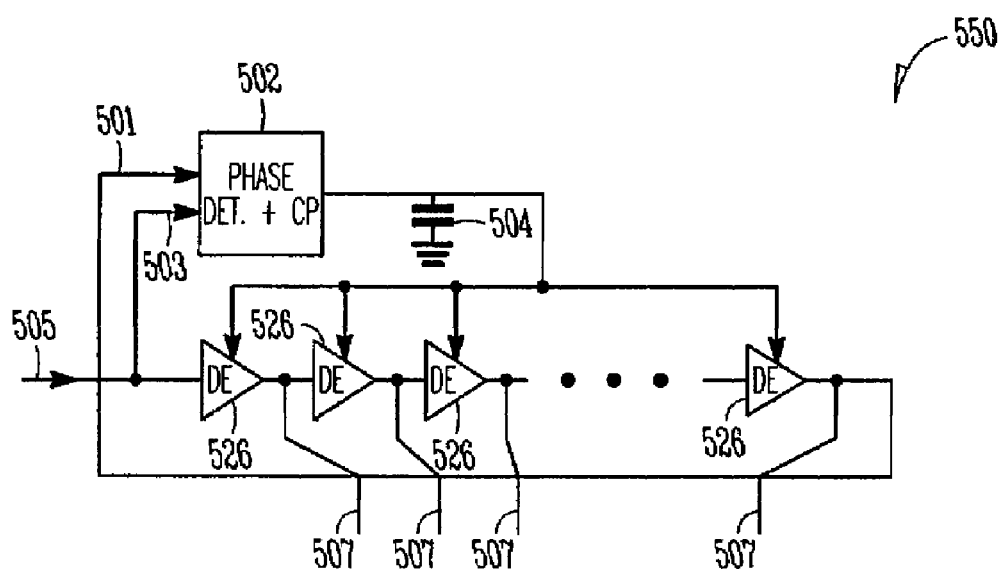

FIGS. 5A and 5B illustrate delay-locked loop (DLL) delay-lines in accordance with some embodiments of the present invention. FIG. 5A illustrates DLL delay-line 500, and FIG. 5B illustrates DLL delay-line 550. In these embodiments, either DLL delay-line 500 or DLL delay-line 550 may be suitable for use as tapped delay-line 106A and for tapped delay-line 106B. DLL delay-lines 500 and 550 may comprise a plurality of delay elements 526 to provide a plurality of phases 507 from square-wave signal 505. In these embodiments, phases 507 may correspond to phases 107 (FIG. 1), and square-wave signal 505 may correspond to square-wave signal 105 (FIG. 1), although the scope of the invention is not limited in this respect.

DLL delay-lines 500 and 550 may comprise phase detector (DET) and charge pump (CP) 502 to generate an output based on a difference between input signals 501 and 503 for controlling the delay provided by delay elements 526. In these embodiments, phase detector and charge pump 502 may drive the phase difference between input signals 501 and 503 to zero. DLL delay-lines 500 and 550 may include loop filters 504 to suppress switching noise and/or noise that may be generated by delta-sigma modulators 114A & 114B (FIG. 1). The use of loop filters 504 may help suppress out-of-band components that may be generated by power amplifiers 118A & 118B, although the scope of the invention is not limited in this respect. In some embodiments, delay elements 526 may comprise either buffers or inverters.

DLL delay-line 500 may also include tunable capacitances 528 which may be used to adjust the delay provided by each of delay elements 526. In some embodiments, continuous tuning by capacitances 528 may help stabilize delay elements 526. In some embodiments, capacitances 528 may be controlled with analog signals, while in other embodiments, capacitances 528 may be controlled digitally. In some embodiments, capacitances 528 may be gate capacitances of field-effect transistors (FETs), although the scope of the invention is not limited in this respect.

FIGS. 6A-6E illustrate a multi-stage digital delay-line with single output port in accordance with some embodiments of the present invention. Digital delay-line 600, illustrated in FIG. 6A, may be suitable for use as both tapped delay-line 106A (FIG. 1) and phase multiplexer 116A (FIG. 1). Digital delay-line 600 may also be suitable for use as both tapped delay-line 106B (FIG. 1) and phase multiplexer 116B (FIG. 1). In these embodiments, the function of phase multiplexers 116A & 116B (FIG. 1) may be included within digital delay-line 600.

Digital delay-line 600 comprises a plurality of stages 602 responsive to control words 605 to in combination provide outphased switching waveform 617 based on square-wave signal 625. In these embodiments, digital delay-line 600 may include decoding logic 604 to provide control words 605 to the plurality of stages 602 based on phase-selection signal 615. In these embodiments, each of the stages 602 may be controllable to either pass an input signal or loop back the input signal to generate, in combination with other stages 602, outphased switching waveform 617 from phase-selection signal 615.

In these embodiments, square-wave signal 625 may correspond to square-wave signal 105 (FIG. 1), phase-selection signal 615 may correspond to either phase-selection signal 115A or phase-selection signal 115B (FIG. 1), and outphased switching waveform 617 may correspond to either outphased switching waveform 117A or outphased switching waveform 117B.

In these embodiments, the delay of digital delay-line 600 may depend on the number of stages 602 configured as through-sections before a loop-back occurs. In these embodiments, outphased switching waveform 617 may be available at the same port irrespective of the control word.

In some of these embodiments, digital delay-line 600 may also include calibration circuitry 606 and combining element 608. Calibration circuitry 606 may provide calibration signals for combining with phase-selection signal 615. Calibration circuitry 606 may also provide calibration signal 609 to baseband processor 108 (FIG. 1). To calibrate the delay of digital delay-line 600, a coarse calibration may first be performed; and then a fine calibration may be performed. The coarse calibration and fine calibration may be performed by calibration circuitry 606.

Figure 6A:
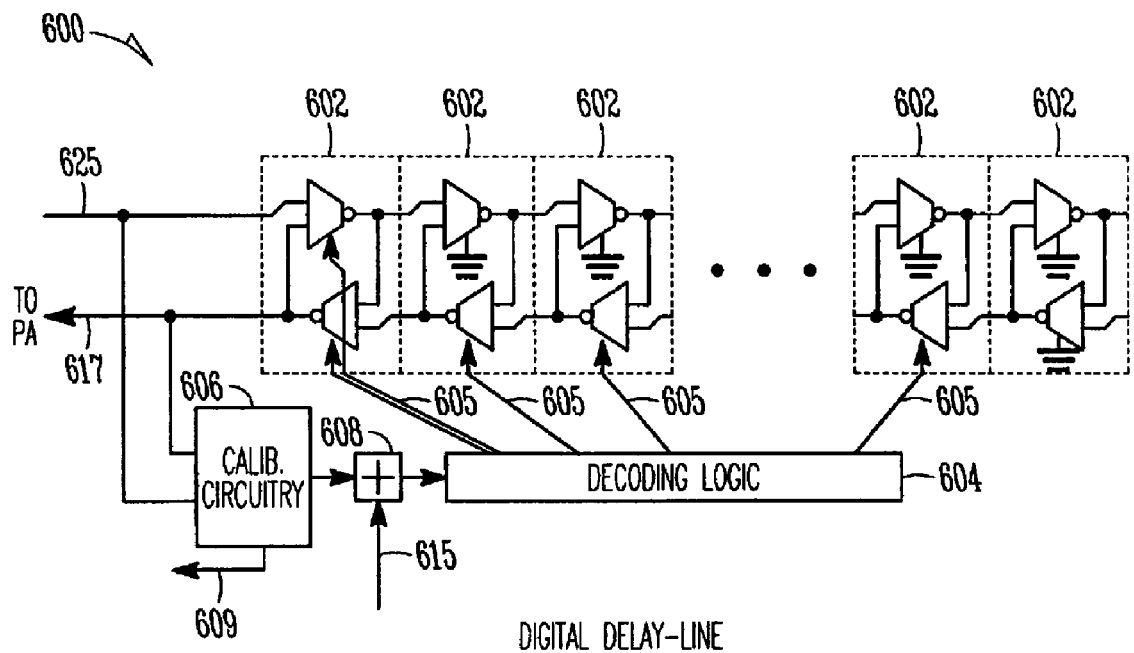
FIGS. 6A-6E illustrate a multi-stage digital delay-line with a single output port in accordance with some embodiments of the present invention.
Figure 6B:
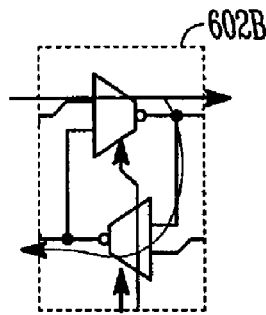
Figure 6C:
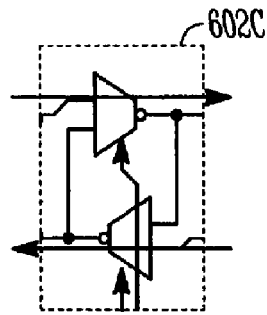
Figure 6D:
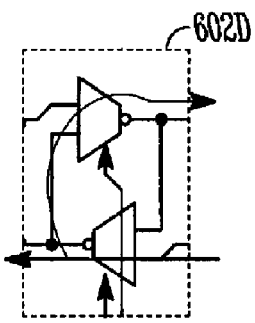
Figure 6E:
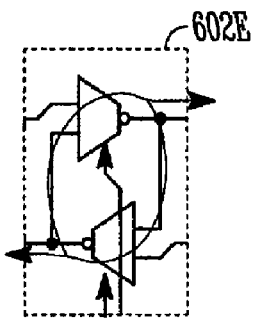

FIG. 6B illustrates the operation of stage 602B with a control word of '00' which may cause stage 602B to loop back the input signal in one direction. FIG. 6C illustrates the operation of stage 602C with a control word of '01' which may cause stage 602C to feed through signals. FIG. 6D illustrates the operation of stage 602D with a control word of '11' which may cause stage 602D to loop back the input signal in the opposite direction as in FIG. 6B. FIG. 6E illustrates the operation of stage 602E with a control word of '01' which may cause stage 602E to latch a signal. Stages 602B, 602C, 602D and 602E may be suitable for use as any of stages 602 in FIG. 6A.

As part of the coarse calibration discussed above, a loop-back at a first stage (minimum delay setting) may be set and the loop-back position may be incremented until a digital phase comparator detects a lock indicating that the return signal is in-phase with a reference signal. The delay per stage may be estimated from the number of stages required to achieve this delay since the RF frequency of square-wave signal 625 is known. Any residual fractional delay error may impact the EVM performance and may be estimated. In some embodiments, calibration circuitry 606 may use a coarse calibration integer as the starting point. After an initial reference phase is fed to digital delay-line 600, the loop may be closed around the current integer stages and the feedback phase may be sampled by a reference clock. If the feedback phase leads, the number of stages within the feedback loop may be increased, and the converse holds if the phase lags. This process may be repeated over a large number of clock cycles and an oversampled output sequence of integers may be decimated to improve the resolution of the delay estimation. In some embodiments, digital baseband processor 108 (FIG. 1) may use a resulting fixed point real number from the delay calibration and the frequency of the reference signal (e.g., from signal generator 102 (FIG. 1)) to compute the stage delay, although the scope of the invention is not limited in this respect.

Referring to FIG. 1, in some embodiments, multicarrier transmitter 100 may be part of a wireless communication device that may communicate orthogonal frequency division multiplexed (OFDM) communication signals over a multicarrier communication channel. The multicarrier communication channel may be within a predetermined frequency spectrum and may comprise a plurality of orthogonal subcarriers. In some embodiments, the multicarrier signals may be defined by closely spaced OFDM subcarriers. Each subcarrier may have a null at substantially a center frequency of the other subcarriers and/or each subcarrier may have an integer number of cycles within a symbol period, although the scope of the invention is not limited in this respect. In some embodiments, multicarrier transmitter 100 may communicate in accordance with a multiple-access technique, such as orthogonal frequency division multiple access (OFDMA), although the scope of the invention is not limited in this respect. In some embodiments, multicarrier transmitter 100 may be part of a wireless communication device that may communicate using spread-spectrum signals, although the scope of the invention is not limited in this respect.

In some embodiments, multicarrier transmitter 100 may be part of a communication station, such as wireless local area network (WLAN) communication station including a Wireless Fidelity (WiFi) communication station, an access point (AP) or a mobile station (MS). In some other embodiments, transmitter 100 may be part of a broadband wireless access (BWA) network communication station, such as a Worldwide Interoperability for Microwave Access (WiMax) communication station, although the scope of the invention is not limited in this respect as transmitter 100 may be part of almost any wireless communication device.

In some embodiments, multicarrier transmitter 100 may be part of a portable wireless communication device, such as a personal digital assistant (PDA), a laptop or portable computer with wireless communication capability, a web tablet, a wireless telephone, a wireless headset, a pager, an instant messaging device, a digital camera, an access point, a television, a medical device (e.g., a heart rate monitor, a blood pressure monitor, etc.), or other device that may receive and/or transmit information wirelessly.

In some embodiments, the frequency spectrums for the communication signals transmitted by multicarrier transmitter 100 may comprise either a 5 gigahertz (GHz) frequency spectrum or a 2.4 GHz frequency spectrum. In these embodiments, the 5 GHz frequency spectrum may include frequencies ranging from approximately 4.9 to 5.9 GHz, and the 2.4 GHz spectrum may include frequencies ranging from approximately 2.3 to 2.5 GHz, although the scope of the invention is not limited in this respect, as other frequency spectrums are also equally suitable. In some BWA network embodiments, the frequency spectrum for the communication signals may comprise frequencies between 2 and 11 GHz, although the scope of the invention is not limited in this respect.

In some embodiments, multicarrier transmitter 100 may transmit signals in accordance with specific communication standards, such as the Institute of Electrical and Electronics Engineers (IEEE) standards including IEEE 802.11(a), 802.11(b), 802.11(g), 802.11(h) and/or 802.11(n) standards and/or proposed specifications for wireless local area networks, although the scope of the invention is not limited in this respect as they may also be suitable to transmit and/or receive communications in accordance with other techniques and standards. In some broadband wireless access network embodiments, transmitter 100 may receive signals in accordance with the IEEE 802.16-2004 and the IEEE 802.16(e) standards for wireless metropolitan area networks (WMANs) including variations and evolutions thereof, although the scope of the invention is not limited in this respect as they may also be suitable to transmit and/or receive communications in accordance with other techniques and standards. For more information with respect to the IEEE 802.11 and IEEE 802.16 standards, please refer to "IEEE Standards for Information Technology—Telecommunications and Information Exchange between Systems"—Local Area Networks—Specific Requirements—Part 11: "Wireless LAN Medium Access Control (MAC) and Physical Layer (PHY), ISO/IEC 8802-11: 1999", and Metropolitan Area Networks—Specific Requirements—Part 16: "Air Interface for Fixed Broadband Wireless Access Systems," May 2005 and related amendments/versions.

Although multicarrier transmitter 100 is described as transmitting multicarrier signals, the scope of the invention is not limited in this respect as other non-multicarrier waveforms, such as single-carrier waveforms, may be transmitted. In some of these alternate embodiments, transmitter 100 may communicate in accordance with standards such as the Pan-European mobile system standard referred to as the Global System for Mobile Communications (GSM). In some of these embodiments, transmitter 100 may also operate in accordance with packet radio services such as the General Packet Radio Service (GPRS) packet data communication service. In some embodiments, transmitter 100 may communicate in accordance with the Universal Mobile Telephone System (UMTS) for the next generation of GSM, which may, for example, implement communication techniques in accordance with 2.5G and 3G wireless standards (see 3GPP Technical Specification, Version 3.2.0, March 2000). In some of these embodiments, transmitter 100 may provide packet data services (PDS) utilizing packet data protocols (PDP). In some embodiments, transmitter 100 may communicate in accordance with other standards or other air-interfaces including interfaces compatible with the enhanced data for GSM evolution (EDGE) standards (see 3GPP Technical Specification, Version 3.2.0, March 2000), although the scope of the invention is not limited in this respect.

In another embodiment, transmitter 100 may communicate in accordance with a short-range wireless standard such as the Bluetooth® short-range digital communication protocol, although the scope of the invention is not limited in this respect. Bluetooth® wireless technology is a de facto standard, as well as a specification for small-form factor, low-cost, short-range radio links between mobile PCs, mobile phones and other portable devices. (Bluetooth is a registered trademark owned by Bluetooth SIG, Inc.).

Figure 7:
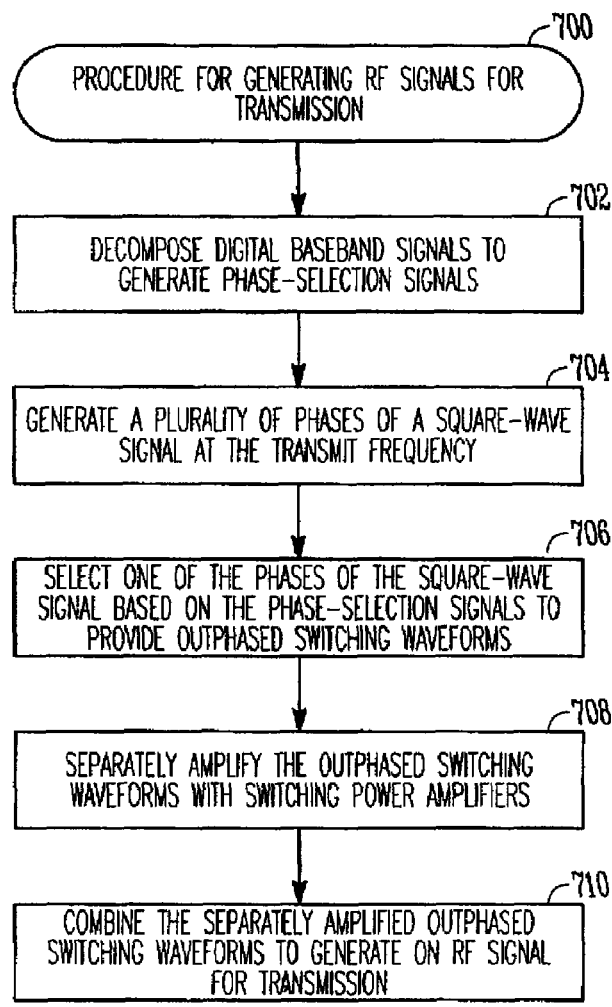
FIG. 7 is a procedure for generating RF signals for transmission in accordance with some embodiments of the present invention.

FIG. 7 is a procedure for generating RF signals for transmission in accordance with some embodiments of the present invention. Procedure 700 may be performed by multicarrier transmitter 100, although other transmitters may also be suitable.

Operation 702 comprises decomposing digital baseband signals to generate phase-selection signals. In some embodiments, operation 702 may be performed by coordinate rotation circuitry 110 (FIG. 1), digital adder elements 112 (FIG. 1) and delta-sigma modulators 114A & 114B (FIG. 1) to generate phase-selection signals 115A & 115B (FIG. 1), although the scope of the invention is not limited in this respect.

Operation 704 comprises generating a plurality of phases of a square-wave signal at a transmit frequency. In some embodiments, operation 704 may be performed by tapped delay-lines 106A & 106B (FIG. 1) to provide phases 107 (FIG. 1), although the scope of the invention is not limited in this respect.

Operation 706 comprises selecting one of the phases of the square-wave signals based on the phase-selection signals to provide outphased switching waveforms. In some embodiments, operation 706 may be performed by phase multiplexers 116A & 116B (FIG. 1), although the scope of the invention is not limited in this respect. In some embodiments, digital delay-line 600 (FIG. 6) may perform both operations 704 and 706.

Operation 708 comprises separately amplifying the outphased switching waveforms with switching power amplifiers. In some embodiments, operation 708 may be performed by switching power amplifiers 118A & 118B (FIG. 1), although the scope of the invention is not limited in this respect.

Operation 710 comprises combining the separately amplified outphased switching waveforms to generate an RF signal for transmission. In some embodiments, operation 710 may be performed by combiner 120 (FIG. 1), although the scope of the invention is not limited in this respect.

Although the individual operations of procedure 700 are illustrated and described as separate operations, one or more of the individual operations may be performed concurrently, and nothing requires that the operations be performed in the order illustrated. Unless specifically stated otherwise, terms such as processing, computing, calculating, determining, displaying, or the like, may refer to an action and/or process of one or more processing or computing systems or similar devices that may manipulate and transform data represented as physical (e.g., electronic) quantities within a processing system's registers and memory into other data similarly represented as physical quantities within the processing system's registers or memories, or other such information storage, transmission or display devices. Furthermore, as used herein, a computing device includes one or more processing elements coupled with computer-readable memory that may be volatile or non-volatile memory or a combination thereof.

Figure 8:
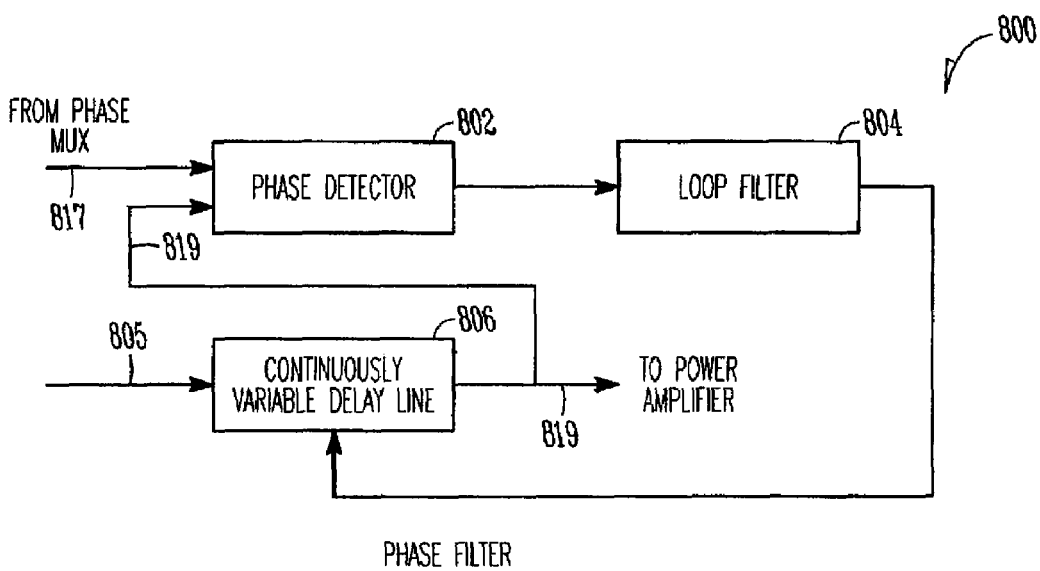
FIG. 8 illustrates a phase filter suitable for use with some embodiments of the present invention.

FIG. 8 illustrates a phase filter suitable for use with some embodiments of the present invention. Phase filter 800 may be suitable for use as phase filter 128A (FIG. 1) and/or phase filter 128B (FIG. 1), although other types of phase filters may also be suitable. Phase filter 800 includes phase detector 802, loop filter 804 and continuously variable delay-line 806. Continuously variable delay-line 806 delays square-wave signal 805 based on the output of loop filter 804, and phase detector 802 compares the phases of input signal 817 with output signal 819 to generate a phase-difference output for loop filter 804.

In some embodiments, when phase filter 800 is used for phase filter 128A (FIG. 1), input signal 817 may correspond to outphased switching waveform 117A (FIG. 1) provided by phase multiplexer 116A (FIG. 1), and output signal 819 may correspond to the outphased switching waveform provided to power amplifier 118A (FIG. 1). In these embodiments, the delay provided by continuously variable delay-line 806 may comprise a replica of the delay provided by tapped delay-line 106A (FIG. 1).

In some embodiments, when phase filter 800 is used for phase filter 128B (FIG. 1), input signal 817 may correspond to outphased switching waveform 117B (FIG. 1) provided by phase multiplexer 116B (FIG. 1), and output signal 819 may correspond to the outphased switching waveform provided to power amplifier 118B (FIG. 1). In these embodiments, the delay provided by continuously variable delay-line 806 may comprise a replica of the delay provided by tapped delay-line 106B (FIG. 1).

In these embodiments, square-wave signal 805 may correspond to square-wave signal 105 (FIG. 1), and the operation of loop filter 804 and continuously variable delay-line 806 may remove out-of-band components from output signal 819. This may result in more efficient amplification by the power amplifiers, although the scope of the invention is not limited in this respect.

Figure 9:
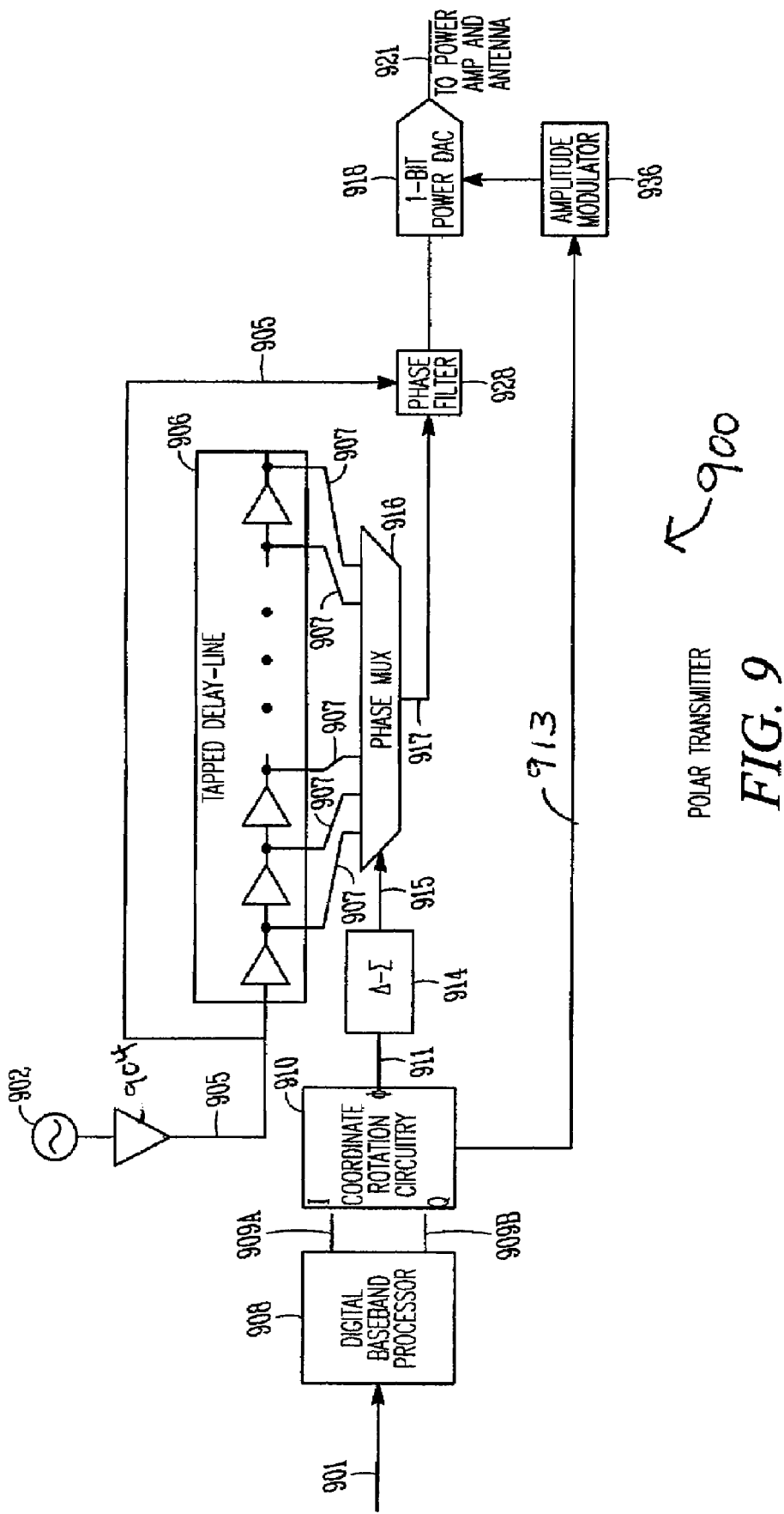
FIG. 9 is a functional block diagram of a polar transmitter in accordance with some embodiments of the present invention.

FIG. 9 is a functional block diagram of a polar transmitter in accordance with some embodiments of the present invention. Polar transmitter 900 comprises tapped delay-line 906 to provide a plurality of phases 907 of square-wave signal 905 at the transmit frequency, and phase multiplexer (MUX) 916 to select one of phases 907 based on phase-selection signal 915 to provide switching waveform 917. In these embodiments, phase-selection signal 915 may be generated by decomposing digital baseband signals 909A & 909B. Switching waveform 917 may be used to generate RF signal 921 for transmission. In these embodiments, switching waveform 917 may comprise a substantially constant-envelope signal.

In these embodiments, coordinate rotation circuitry 910 may decompose I and Q components of digital baseband signals 909A & 909B into phi component 911 and amplitude component 913. Switching waveform 917 may comprise square-wave signal 905 delayed by phi component 911.

In these embodiments, polar transmitter 900 may also include power digital-to-analog converter (DAC) 918 to convert switching waveform 917 to RF signal 921, and amplitude modulator 936 to amplitude-modulate the components of RF signal 921 based on amplitude component 913 provided by coordinate rotation circuitry 910. The output of power DAC 918 may be amplified by one or more power amplifiers prior to transmission by one or more antennas. In some alternate embodiments, one or more switching power amplifiers may be used in place of power DAC 918, although the scope of the invention is not limited in this respect.

In some embodiments, polar transmitter 900 may also comprise phase filter 928 to help remove out-of-band components from switching waveform 917 prior to amplification by power DAC 918. Phase filter 800 (FIG. 8) may be suitable for use as phase filter 928, although other phase filters and DLLs may also be suitable.

In polar transmitter 900, input bit stream 901 may correspond to input bit stream 101 (FIG. 1), digital baseband processor 908 may be similar to digital baseband processor 108 (FIG. 1), and components of digital baseband signals 909A & 909B may correspond respectively to components of digital baseband signals 109A & 109B. Also in polar transmitter 900, coordinate rotation circuitry 910 may be similar to coordinate rotation circuitry 110 (FIG. 1), delta-sigma ($\Delta$-$\Sigma$) modulator 914 may be similar to either delta-sigma ($\Delta$-$\Sigma$) modulator 114A or 114B (FIG. 1), tapped delay-line 906 may be similar to either tapped delay-line 106A or 106B (FIG. 1), and phase multiplexer 916 may be similar to either phase multiplexer 116A or 116B (FIG. 1). Also in polar transmitter 900, signal generator 902 may be similar to signal generator 102 (FIG. 1) and buffer 904 may be similar to buffer 104 (FIG. 1).

Some embodiments of the invention may be implemented a combination of hardware, firmware and/or software. Some embodiments of the invention may also be implemented as instructions stored on a machine-readable medium, which may be read and executed by at least one processor to perform the operations described herein. A machine-readable medium may include any mechanism for storing or transmitting information in a form readable by a machine (e.g., a computer). For example, a machine-readable medium may include read-only memory (ROM), random-access memory (RAM), magnetic disk storage media, optical storage media, flash-memory devices, electrical, optical, acoustical or other form of propagated signals (e.g., carrier waves, infrared signals, digital signals, etc.), and others.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims.

In the foregoing detailed description, various features are occasionally grouped together in a single embodiment for the purpose of streamlining the disclosure. This method of disclosure is not to be interpreted as reflecting an intention that the claimed embodiments of the subject matter require more features than are expressly recited in each claim. Rather, as the following claims reflect, invention may lie in less than all features of a single disclosed embodiment. Thus, the following claims are hereby incorporated into the detailed description, with each claim standing on its own as a separate preferred embodiment.

What is claimed is:

1. A multicarrier transmitter comprising:
   circuitry to decompose digital baseband signals to generate phase-selection signals;
   tapped delay-lines to provide a plurality of phases of a square-wave signal at a transmit frequency; and
   circuitry to select one of the phases of the square-wave signals from the tapped delay-lines based on the phase-selection signals to provide outphased switching waveforms to generate an RF signal for transmission.

2. The transmitter of claim 1 wherein the outphased switching waveforms comprise substantially constant-envelope signals representing two outphased components of the RE signal for transmission.

3. The transmitter of claim 1 further comprising:
a signal generator to generate an RF signal at the transmit frequency; and
a buffer to generate the square-wave signal at the transmit frequency from the RF signal for receipt by the tapped delay-lines,
wherein the tapped delay-lines comprise a plurality of delay elements having intrinsic delays substantially less than a period of the square-wave signal, and
wherein each delay element provides one of the phases.

4. The transmitter of claim 1 wherein the tapped delay-lines comprise delay vernier delay-lines,
wherein each delay vernier delay-line comprises:
a plurality of latches to provide the phases;
a first plurality of delay elements to delay the square-wave signal and provide delayed versions of the square-wave signal to latch-inputs of the latches; and
a second plurality of delay elements to delay the square-wave signal and provide delayed versions of the square-wave signal to clock-inputs of the latches.

5. The transmitter of claim 1 wherein the tapped delay-lines comprise coupled oscillator delay-lines, and
wherein each coupled oscillator delay-line comprises:
a plurality of delay elements configured into pluralities of delay-lines, wherein outputs of some of the delay elements provide the phases of the square-wave signal; and
wire-mapping circuitry configurable to re-route connections between the pluralities of delay-lines.

6. The transmitter of claim 1 wherein the tapped delay-lines comprise delay-locked loop (DLL) delay-lines, and
wherein each DLL delay-line comprises:
a plurality of delay elements arranged in a delay-line to delay the square-wave signal and provide the phases;
a phase detector and charge pump to drive a phase-difference between an output of the delay-line and the square-wave signal to zero; and
tunable capacitors to stabilize the delay elements.

7. The transmitter of claim 1 wherein the tapped delay-lines comprise digital delay-lines, each digital delay-line comprising a plurality of stages responsive to control words to each provide one of the phases from receipt of the square-wave signal,
wherein the circuitry to select one of the phases comprises decoding logic to provide the control words to the plurality of stages based on one of phase-selection signals, and
wherein each of the stages is controllable to pass input signals or to loop back the input signals to generate, in combination with the other stages of the plurality, a selected one of the phases.

8. A multicarrier transmitter comprising:
circuitry to decompose digital baseband signals to generate phase-selection signals;
tapped delay-lines to provide a plurality of phases of a square-wave signal at a transmit frequency; and
circuitry to select one of the phases of the square-wave signals from the tapped delay-lines based on the phase-selection signals to provide outphased switching waveforms to generate an RF signal for transmission,
wherein the circuitry to select one of the phases comprises phase multiplexers comprising:
a first phase multiplexer to select an output based on a first outphased component of the decomposed baseband signals; and
a second phase multiplexer to select an output based on another outphased component of the decomposed baseband signals.

9. The transmitter of claim 8 wherein the tapped delay-lines comprise:
a first tapped delay-line to provide a first plurality of phases of the square-wave signal to the first phase multiplexer; and
a second tapped delay-line to provide a second plurality of phases of the square-wave signal to the second phase multiplexer.

10. A multicarrier transmitter comprising:
circuitry to decompose digital baseband signals to generate phase-selection signals;
tapped delay-lines to provide a plurality of phases of a square-wave signal at a transmit frequency;
circuitry to select one of the phases of the square-wave signals from the tapped delay-lines based on the phase-selection signals to provide outphased switching waveforms to generate an RF signal for transmission;
switching power amplifiers operating in a non-linear range to separately amplify the outphased switching waveforms, the outphased switching waveforms comprising substantially constant-envelope square-wave signals; and
a combiner to combine the separately amplified outphased switching waveforms to generate the RF signal for transmission by an antenna.

11. The transmitter of claim 10 further comprising phase filters to help remove out-of-band components from the outphased switching waveforms prior to amplification by the switching power amplifiers, the phase filters comprising:
continuously variable delay-lines to provide output signals for amplification by the switching power amplifiers;
phase detectors to compare the outphased switching waveforms with the output signals of the continuously variable delay-lines and provide phase-difference signals; and
loop filters to filter the phase-difference signals and provide filtered phase-difference signals to the continuously variable delay-lines for use in delaying the square-wave signals to generate the output signals.

12. A multicarrier transmitter comprising:
circuitry to decompose digital baseband signals to generate phase-selection signals;
tapped delay-lines to provide a plurality of phases of a square-wave signal at a transmit frequency; and
circuitry to select one of the phases of the square-wave signals from the tapped delay-lines based on the phase-selection signals to provide outphased switching waveforms to generate an RF signal for transmission,
wherein the circuitry to decompose the digital baseband signals comprises coordinate rotation circuitry to decompose in-phase (I) and quadrature-phase (Q) components of the digital baseband signals into a theta component and a phi component,
wherein a first of the outphased switching waveforms comprises the square-wave signals delayed by a sum of the theta component and the phi component, and
wherein a second of the outphased switching waveforms comprises the square-wave signals delayed by a difference between the theta component and the phi component.

13. The transmitter of claim 12 wherein the circuitry to generate the phase-selection signals comprises digital adder elements to generate a sum component and a difference component, the sum component comprising a sum of the theta component and the phi component, the difference component comprising a difference between the theta component and the phi component.

14. The transmitter of claim 13 wherein the circuitry to generate the phase-selection signals further comprises:
   a first delta-sigma modulator to generate a first of the phase-selection signals from the sum component; and
   a second delta-sigma modulator to generate a second of the phase-selection signals from the difference component.

15. A method performed by a multicarrier transmitter for transmitting a radio-frequency (RF) signal comprising:
   decomposing digital baseband signals to generate phase-selection signals;
   generating a plurality of phases of a square-wave signal at a transmit frequency; and
   selecting one of the phases of the square-wave signals based on the phase-selection signals to provide outphased switching waveforms for use in generating an RF signal for transmission,
   wherein the outphased switching waveforms comprise substantially constant-envelope signals representing two outphased components of the RF signal for transmission.

16. The method of claim 15 further comprising:
   separately amplifying the outphased switching waveforms with switching power amplifiers operating in a non-linear range, the outphased switching waveforms comprising substantially constant-envelope square-wave signals; and
   combining the separately amplified outphased switching waveforms to generate the RF signal for transmission by an antenna.

17. The method of claim 15 wherein decomposing comprises decomposing in-phase (I) and quadrature-phase (Q) components of the digital baseband signals into a theta component and a phi component,
   wherein a first of the outphased switching waveforms comprises the square-wave signals delayed by a sum of the theta component and the phi component, and
   wherein a second of the outphased switching waveforms comprises the square-wave signals delayed by a difference between the theta component and the phi component.

18. The method of claim 17 further generating a sum component and a difference component, the sum component comprising a sum of the theta component and the phi component, the difference component comprising a difference between the theta component and the phi component,
   wherein a first of the phase-selection signals is generated from the sum component using a first delta-sigma modulator, and a second of the phase-selection signals is generated from the difference component by a second delta-sigma modulator.

19. The method of claim 15 further comprising:
   generating an RF signal at the transmit frequency; and
   buffering the RF signal to generate the square-wave signal at the transmit frequency.

20. A multicarrier transmitter comprising:
   coordinate rotation circuitry to decompose in-phase (I) and quadrature-phase (Q) components of digital baseband signals into a theta component and a phi component;
   a first delta-sigma modulator to generate a first phase-selection signal from a sum of the theta component and the phi component;
   a second delta-sigma modulator to generate a second phase-selection signal from a difference between the theta component and the phi component;
   tapped delay-lines to provide a plurality of phases of a square-wave signal at a transmit frequency; and
   circuitry to select one of the phases of the square-wave signals from the tapped delay-lines based on the phase-selection signals to provide outphased switching waveforms.

21. The multicarrier transmitter of claim 20 further comprising:
   a first switching power amplifier to amplify a first of the outphased switching waveforms; and
   a second switching power amplifier to amplify a second of the outphased switching waveforms; and
   a combiner to combine the amplified outphased switching waveforms to generate an RF signal for transmission,
   wherein the outphased switching waveforms comprise substantially constant-envelope square-wave signals.

22. The multicarrier transmitter of claim 21 wherein the coordinate rotation circuitry encodes amplitude and phase information contained within the in-phase (I) and quadrature-phase (Q) components of the digital baseband signals solely into phase information within the theta component and the phi component.

23. The multicarrier transmitter of claim 21 wherein the first of the outphased switching waveforms comprises the square-wave signals delayed by the sum of the theta component and the phi component, and
   wherein the second of the outphased switching waveforms comprises the square-wave signals delayed by the difference between the theta component and the phi component.

24. The transmitter of claim 21 further comprising phase filters to help remove out-of-band components from the outphased switching waveforms prior to amplification by the switching power amplifiers, the phase filters comprising:
   continuously variable delay-lines to provide output signals for amplification by the switching power amplifiers;
   phase detectors to compare the outphased switching waveforms with the output signals of the continuously variable delay-lines and provide phase-difference signals; and
   loop filters to filter the phase-difference signals and provide filtered phase-difference signals to the continuously variable delay-lines for use in delaying the square-wave signals to generate the output signals.

25. A polar transmitter comprising:
   circuitry to decompose digital baseband signals to generate a phase-selection signal;
   a tapped delay-line to provide a plurality of phases of a square-wave signal at a transmit frequency; and
   a phase multiplexer to select one of the phases of the square-wave signals from the tapped delay-line based on the phase-selection signal to provide a switching waveform to generate a radio-frequency (RF) signal for transmission.

26. The polar transmitter of claim 25 wherein the switching waveform comprises a substantially constant-envelope signal,
   wherein the circuitry to decompose the digital baseband signals comprises coordinate rotation circuitry to decompose in-phase (I) and quadrature-phase (Q) components of the digital baseband signals into a phi component and an amplitude component, and
   wherein the switching waveform comprises the square-wave signals delayed by the phi component.

27. The polar transmitter of claim 26 further comprising:
   a power digital-to-analog converter (DAC) to convert the switching waveform to the RF signal; and an amplitude modulator coupled to the power DAC to amplitude modulate components of the RF signal based on the amplitude component provided by the coordinate rotation circuitry.

28. The polar transmitter of claim 26 further comprising a phase filter to help remove out-of-band components from the switching waveform prior to amplification by the power DAC, the phase filter comprising:

a continuously variable delay-line to provide an output signal for amplification by the power DAC;

a phase detector to compare the switching waveform with the output signal of the continuously variable delay-line to generate a phase-difference signal; and a loop filter to filter the phase-difference signal and provide a filtered phase-difference signal to the continuously variable delay-line for use in delaying the square-wave signal to generate the output signal for the power DAC.

* * * * *

UNITED STATES PATENT AND TRADEMARK OFFICE
CERTIFICATE OF CORRECTION

| | |
|---|---|
| PATENT NO. | : 7,715,493 B2 |
| APPLICATION NO. | : 11/464352 |
| DATED | : May 11, 2010 |
| INVENTOR(S) | : Ashoke Ravi et al. |

Page 1 of 1

It is certified that error appears in the above-identified patent and that said Letters Patent is hereby corrected as shown below:

In column 14, line 66, in Claim 2, delete "RE" and insert -- RF --, therefor.

Signed and Sealed this

Twenty-ninth Day of June, 2010

David J. Kappos
*Director of the United States Patent and Trademark Office*